United States Patent
An et al.

(10) Patent No.: US 11,539,500 B2
(45) Date of Patent: Dec. 27, 2022

(54) SIGNAL RECEIVING DEVICE, AND A SEMICONDUCTOR APPARATUS AND A SEMICONDUCTOR SYSTEM INCLUDING THE SIGNAL RECEIVING DEVICE

(71) Applicant: SK hynix Inc., Icheon-si (KR)

(72) Inventors: Soon Sung An, Icheon-si (KR); Kwan Su Shon, Icheon-si (KR); Jin Ha Hwang, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/478,591

(22) Filed: Sep. 17, 2021

(65) Prior Publication Data

US 2022/0006605 A1 Jan. 6, 2022

Related U.S. Application Data

(62) Division of application No. 16/940,111, filed on Jul. 27, 2020, now Pat. No. 11,153,066.

(30) Foreign Application Priority Data

Dec. 20, 2019 (KR) .................. 10-2019-0171631

(51) Int. Cl.
*H04L 7/00* (2006.01)
*H04L 7/02* (2006.01)
(Continued)

(52) U.S. Cl.
CPC .............. *H04L 7/0079* (2013.01); *H04L 7/02* (2013.01); *G11C 7/10* (2013.01); *G11C 7/222* (2013.01); *H03K 19/017509* (2013.01)

(58) Field of Classification Search
CPC .......... H04L 7/0079; H04L 7/02; H04L 7/033
(Continued)

(56) References Cited

U.S. PATENT DOCUMENTS

| 8,836,394 | B2 | 9/2014 | Zerbe et al. |
| 10,171,228 | B2 | 1/2019 | Hosaka |
| 11,153,066 | B2 * | 10/2021 | An ................. G11C 7/1084 |

FOREIGN PATENT DOCUMENTS

| CN | 102349244 A | 2/2012 |
| CN | 108292924 A | 7/2018 |

(Continued)

*Primary Examiner* — Hai L Nguyen
(74) *Attorney, Agent, or Firm* — William Park & Associates Ltd.

(57) ABSTRACT

A signal receiving device may include a high-speed receiving circuit, a low-speed receiving circuit, a low-speed synchronization circuit and a low-speed synchronization circuit. The high-speed receiving circuit receives an input signal and generate a high-speed received signal in a first operation mode. The high-speed synchronization circuit generates a high-speed synchronized signal to synchronize the high-speed received signal with a clock signal. The low-speed receiving circuit receives the input signal and generate a low-speed received signal in a second operation mode. The low-speed synchronization circuit generates a low-speed synchronized signal to synchronize the low-speed received signal with the clock signal. According to an operation mode, one of the high-speed synchronized signal and the low-speed synchronized signal is selected as an internal signal.

13 Claims, 5 Drawing Sheets

(51) Int. Cl.
    *H03K 19/0175*    (2006.01)
    *G11C 7/22*    (2006.01)
    *G11C 7/10*    (2006.01)
(58) Field of Classification Search
    USPC ........................................ 327/141, 333, 144
    See application file for complete search history.

(56) References Cited

FOREIGN PATENT DOCUMENTS

| | | |
|---|---|---|
| CN | 110347630 A | 10/2019 |
| KR | 1020180051108 A | 5/2018 |
| KR | 1020190130833 A | 11/2019 |

\* cited by examiner

SIGNAL RECEIVING DEVICE, AND A SEMICONDUCTOR APPARATUS AND A SEMICONDUCTOR SYSTEM INCLUDING THE SIGNAL RECEIVING DEVICE

CROSS-REFERENCES TO RELATED APPLICATION

The present application is a divisional application of U.S. patent application Ser. No. 16/940,111, filed on Jul. 27, 2020, and claims priority under 35 U.S.C. § 119(a) to Korean application number 10-2019-0171631, filed on Dec. 20, 2019, in the Korean Intellectual Property Office, which is incorporated herein by reference in its entirety.

BACKGROUND

1. Technical Field

Various embodiments generally relate to an integrated circuit technology, and more particularly, to a signal receiving device, and a semiconductor apparatus and a semiconductor system including the same.

2. Related Art

An electronic device may include many electronic components. Among the electronic components, a computer system may include a large number of semiconductor apparatuses composed of semiconductors. The semiconductor apparatuses constituting the computer system may communicate with each other while transmitting and receiving clocks and data. The semiconductor apparatuses may operate in synchronization with a clock signal. The semiconductor apparatuses may internally generate various signals based on a signal transferred from an external device. The semiconductor apparatuses include a signal receiving device to receive the signal transmitted from the external device. The computer system and the semiconductor apparatus may operate in various communication environments. Various communication environments may be formed depending on operation frequencies or the voltage levels of supply voltages. In general, a signal transmitted between semiconductor apparatuses in an environment with a low supply voltage and a high frequency has a high frequency and a low amplitude. Therefore, a receiver with relatively high performance needs to be used. On the other hand, a signal transmitted between semiconductor apparatuses in an environment with a high supply voltage and a low frequency has a low frequency and a high amplitude. Therefore, a receiver with relatively low performance needs to be used in order to reduce power consumption.

SUMMARY

In an embodiment, a signal receiving device may include a high speed receiving circuit, a high-speed synchronization circuit, a low-speed receiving circuit, a low-speed synchronization circuit, and a first selection circuit. The high-speed receiving circuit may be configured to receive an input signal and generate a high-speed received signal in a first operation mode. The high-speed synchronization circuit may be configured to synchronize the high-speed received signal with a clock signal to generate a high-speed synchronized signal. The low-speed receiving circuit may be configured to receive the input signal and generate a low-speed received signal in a second operation mode. The low-speed synchronization circuit may be configured to synchronize the low-speed received signal with the clock signal to generate a low-speed synchronized signal. The first selection circuit may be configured to output one of the high-speed synchronized signal and the low-speed synchronized signal as an internal signal according to an operation mode.

In an embodiment, a signal receiving device may include a first receiving circuit, a second receiving circuit, a first selection circuit, a high-speed synchronization circuit, a low-speed receiving circuit, a low-speed synchronization circuit, and a second selection circuit. The first receiving circuit may comprise a buffer and a first amplifier. The first receiving circuit may be configured to receive an input signal and generate a first received signal. The second receiving circuit may comprise a second amplifier. The second receiving circuit may be configured to receive the input signal and generate a second received signal. The first selection circuit may be configured to output one of the first and second received signals as a high-speed received signal. The high-speed synchronization circuit may be configured to sample the high-speed received signal in synchronization with a clock signal to generate a high-speed synchronized signal. The low-speed receiving circuit may be configured to receive the input signal and generate a low-speed received signal. The low-speed synchronization circuit may be configured to sample the low-speed received signal in synchronization with the clock signal to generate a low-speed synchronized signal. The second selection circuit may be configured to output one of the high-speed synchronized signal and the low-speed synchronized signal as an internal signal according to an operation frequency.

In an embodiment, a semiconductor apparatus may include a plurality of high-speed data receiving circuits, a high-speed strobe receiving circuit, a plurality of high-speed synchronization circuits, a plurality of low-speed receiving circuits, a low-speed strobe receiving circuit, a plurality of low-speed synchronization circuits, and a first selection circuit. The plurality of high-speed data receiving circuits may be configured to receive a plurality of data through a plurality of high-speed data pads, respectively, and generate a plurality of high-speed received signals. The high-speed strobe receiving circuit may be configured to receive a data strobe signal and a complementary data strobe signal through a plurality of high-speed strobe pads. The plurality of high-speed synchronization circuits may be configure to synchronize the plurality of high-speed received signals with the data strobe signal and the complementary data strobe signal, respectively, to generate a plurality of high-speed synchronized signals. The plurality of low-speed data receiving circuits may be configured to receive the plurality of data through a plurality of low-speed data pads, respectively, and generate a plurality of low-speed received signals. The low-speed strobe receiving circuit may be configured to receive the data strobe signal through one or more low-speed strobe pads. The plurality of low-speed synchronization circuits may be configured to synchronize the plurality of low-speed received signals with the data strobe signal to generate a plurality of low-speed synchronized signals. The first selection circuit may be configured to output the plurality of high-speed synchronized signals as a plurality of internal signals or output the plurality of low-speed synchronized signals as the plurality of internal signals, according to an operation frequency.

DETAILED DESCRIPTION

Figure 1:
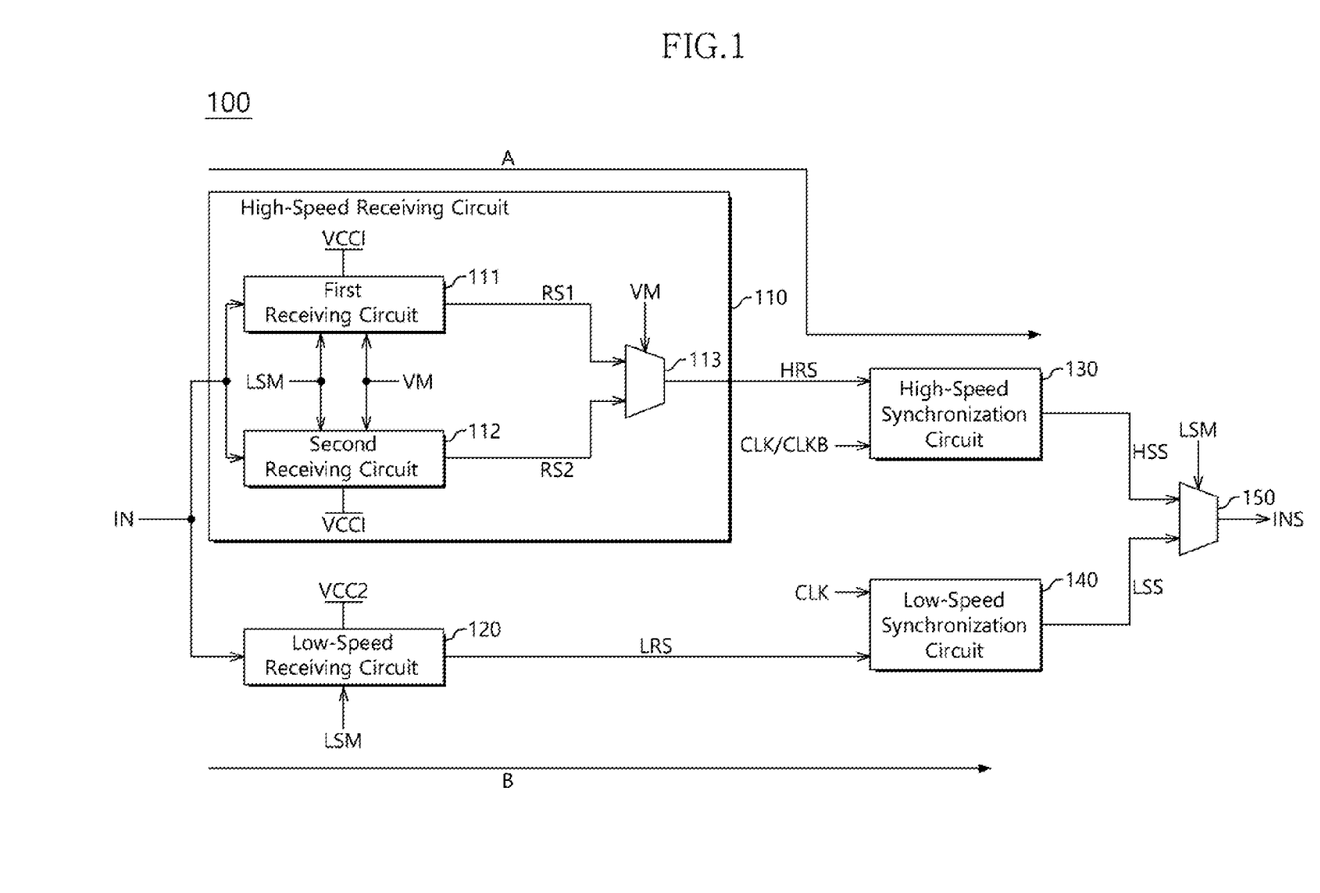
FIG. 1 is a diagram illustrating a configuration of a signal receiving device in accordance with an embodiment.

FIG. 1 is a diagram illustrating a configuration of a signal receiving device 100 in accordance with an embodiment. Referring to FIG. 1, the signal receiving device 100 may receive an input signal IN and generate an internal signal INS. The input signal IN may be a signal transmitted from the outside of a semiconductor apparatus including the signal receiving device 100 or another circuit and/or another device coupled to the signal receiving device 100. The signal receiving device 100 may receive the input signal IN and generate a received signal, and output the received signal as the internal signal INS in synchronization with a clock signal CLK. The signal receiving device 100 may include a plurality of receiving paths, and receive the input signal IN through one or more receiving paths of the plurality of receiving paths according to an operation frequency and/or the voltage level of an external supply voltage. In an embodiment, the operation frequency may correspond to a frequency of a clock signal which the receiving device 100 receives and/or with which the receiving device 100 is operably synchronized. In an embodiment, the external supply voltage may correspond to a power supply voltage of the receiving device 100.

The signal receiving device 100 may include a high-speed receiving path A and a low-speed receiving path B. When the operation frequency is relatively high, the signal receiving device 100 may generate the internal signal INS from the input signal IN through the high-speed receiving path A. When the operation frequency is relatively low, the signal receiving device 100 may generate the internal signal INS from the input signal IN through the low-speed receiving path B. When the operation frequency is high, the input signal IN may have a small amplitude and a short period. In this case, since the signal receiving device 100 has a small margin for receiving the input signal IN, the high-speed receiving path A may include a receiving circuit with relatively high performance. On the other hand, when the operation frequency is low, the input signal IN may have a large amplitude and a long period. In this case, since the signal receiving device 100 may have a margin enough to receive the input signal IN, the low-speed receiving path B might not require a receiving circuit with high performance, but include a receiving circuit capable of minimizing power consumption. In an embodiment, an operation frequency that is high is greater than an operation frequency that is low. For example, when the operation frequency is high, the input signal IN may have a smaller amplitude and a shorter period than an input signal IN corresponding to an operation frequency that is low.

The signal receiving device 100 may include a high-speed receiving circuit 110, a low-speed receiving circuit 120, a high-speed synchronization circuit 130, a low-speed synchronization circuit 140 and a selection circuit 150. The high-speed receiving circuit 110 and the high-speed synchronization circuit 130 may be included in the high-speed receiving path A, and the low-speed receiving circuit 120 and the low-speed synchronization circuit 140 may be included in the low-speed receiving path B. The high-speed receiving circuit 110 may receive the input signal IN and generate a high-speed received signal HRS in a first operation mode. The first operation mode may indicate an operation mode which is performed when the operation frequency is relatively high. The high-speed receiving circuit 110 may receive the input signal IN and generate the high-speed received signal HRS, when the operation frequency is relatively high. The high-speed synchronization circuit 130 may receive the high-speed received signal HRS generated through the high-speed receiving circuit 110. The high-speed synchronization circuit 130 may receive a clock signal CLK. The high-speed synchronization circuit 130 may generate a high-speed synchronized signal HSS by synchronizing the high-speed received signal HRS with the clock signal CLK. In an embodiment, the high-speed synchronization circuit 130 may sample the high-speed received signal in synchronization with the clock signal CLK to generate the high-speed synchronized signal HSS. For example, the high-speed synchronization circuit 130 may generate the high-speed synchronized signal HSS by sampling the high-speed received signal HRS at a rising edge of the clock signal CLK. In an embodiment, the high-speed synchronization circuit 130 may generate the high-speed synchronized signal HSS by sampling the high-speed received signal HRS at a falling edge of the clock signal CLK. The clock signal CLK may have a frequency corresponding to the operation frequency. In an embodiment, the clock signal CLK may have a lower frequency than the operation frequency, and the high-speed synchronization circuit 130 may receive the clock signal CLK with a complementary clock signal CLKB. The high-speed synchronization circuit 130 may generate the high-speed synchronized signal HSS from the high-speed received signal HRS in synchronization with rising edges of the clock signal CLK and the complementary clock signal CLKB.

The low-speed receiving circuit 120 may receive the input signal IN and generate a low-speed received signal LRS in a second operation mode. The second operation mode may indicate an operation mode which is performed when the operation frequency is relatively low. The low-speed receiving circuit 120 may receive the input signal IN and generate the low-speed received signal LRS, when the operation frequency is relatively low. The low-speed synchronization circuit 140 may receive the low-speed received signal LRS generated through the low-speed receiving circuit 120. The low-speed synchronization circuit 140 may receive the clock signal CLK. The low-speed synchronization circuit 140 may generate a low-speed synchronized signal LSS by synchronizing the low-speed received signal LRS with the clock signal CLK. In an embodiment, the low-speed synchronization circuit 140 may sample the low-speed received signal LRS in synchronization with the clock signal CLK to generate a low-speed synchronized signal LSS. For example, the low-speed synchronization circuit 140 may generate the low-speed synchronized signal LSS by sampling the low-speed received signal LRS at a rising edge of the clock signal CLK. In an embodiment, the low-speed synchronization circuit 140 may generate the low-speed synchronized signal LSS by sampling the low-speed received signal LRS at a falling edge of the clock signal CLK.

The selection circuit 150 may receive the high-speed synchronized signal HSS and the low-speed synchronized signal LSS from the high-speed synchronization circuit 130 and the low-speed synchronization circuit 140, respectively. The selection circuit 150 may output one of the high-speed synchronized signal HSS and the low-speed synchronized signal LSS as the internal signal INS according to the operation frequency. The selection circuit 150 may output the high-speed synchronized signal HSS as the internal signal INS in the first operation mode. The selection circuit 150 may output the low-speed synchronized signal LSS as the internal signal INS in the second operation mode.

The high-speed receiving circuit 110 may include a plurality of receiving paths, and receive the input signal IN through one or more receiving paths among the plurality of receiving paths according to a voltage mode. The voltage mode may include a first voltage mode and a second voltage mode. The first voltage mode may indicate an operation mode which is performed when the voltage level of an external supply voltage is relatively low. The external supply voltage may be a supply voltage which is supplied from an external power supply in order to operate the signal receiving device. The second voltage mode may indicate an operation mode which is performed when the voltage level of the external supply voltage is relatively high. The high-speed receiving circuit 110 may include a first receiving circuit 111, a second receiving circuit 112 and a selection circuit 113. The first receiving circuit 111 may receive the input signal IN and generate a first received signal RS1 in the first voltage mode. The second receiving circuit 112 may receive the input signal IN and generate a second received signal RS2 in the second voltage mode. The selection circuit 113 may receive the first and second received signals RS1 and RS2, and output one of the first and second received signals RS1 and RS2 as the high-speed received signal HRS according to the voltage mode. The selection circuit 113 may output the first received signal RS1 as the high-speed received signal HRS in the first voltage mode. The selection circuit 113 may output the second received signal RS2 as the high-speed received signal HRS in the second voltage mode. In an embodiment a relatively low external supply voltage has a voltage level that is less than a voltage level of a relatively high external supply voltage.

The operation frequency and/or the operation mode may be distinguished according to a frequency mode signal LSM. The frequency mode signal LSM may be a command signal or control signal which may be generated to indicate the operation frequency and/or the operation mode. The frequency mode signal LSM may be generated by sensing the operation frequency, and generated based on information on a communication environment set between the signal receiving device 100 and a signal transmitting device that transmits the input signal IN. For example, the frequency mode signal LSM may have a logic low level in the first operation mode, and have a logic high level in the second operation mode. The voltage mode may be distinguished according to a voltage mode signal VM. The voltage mode signal VM may be a command signal or control signal which may be generated to indicate the voltage mode. The voltage mode signal VM may be generated by sensing the voltage level of the external supply voltage, and generated based on information on the voltage level of an external supply voltage supplied to the signal receiving device 100. For example, the voltage mode signal VM may have a logic low level in the first voltage mode, and have a logic high level in the second voltage mode.

The first receiving circuit 111 may receive the frequency mode signal LSM and the voltage mode signal VM. The first receiving circuit 111 may be enabled when the frequency mode signal LSM and the voltage mode signal VM are all at a logic low level, and receive the input signal IN and generate the first received signal RS1. The second receiving circuit 112 may be enabled when the frequency mode signal LSM is at a logic low level and the voltage mode signal VM is at a logic high level, and receive the input signal IN and generate the second received signal RS2. The selection circuit 113 may receive the voltage mode signal VM. The selection circuit 113 may output the first received signal RS1 as the high-speed received signal HRS, when the voltage mode signal VM is at a logic low level. The selection circuit 113 may output the second received signal RS2 as the high-speed received signal HRS, when the voltage mode signal VM is at a logic high level. The low-speed receiving circuit 120 may receive the frequency mode signal LSM. The low-speed receiving circuit 120 may be enabled when the frequency mode signal LSM is at a logic high level, and receive the input signal IN and generate the low-speed received signal LRS. The selection circuit 150 may receive the frequency mode signal LSM. The selection circuit 150 may output the high-speed synchronized signal HSS as the internal signal INS, when the frequency mode signal LSM is at a logic low level. The selection circuit 150 may output the low-speed synchronized signal LSS as the internal signal INS, when the frequency mode signal LSM is at a logic high level.

Figure 2:
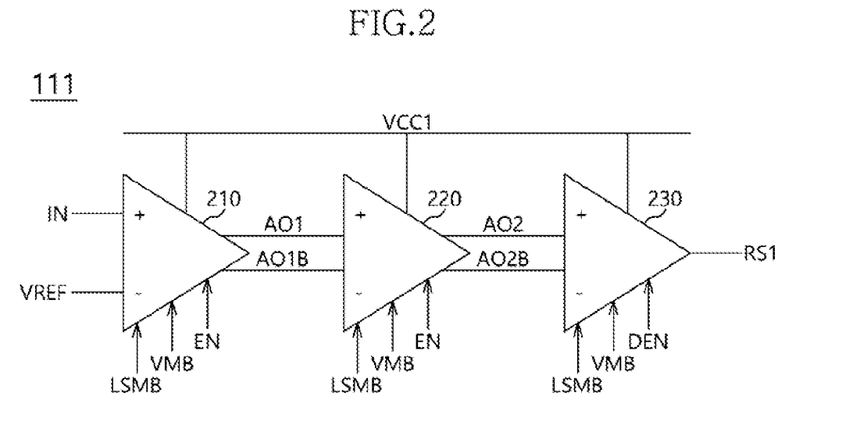
FIG. 2 is a diagram illustrating a configuration of a first receiving circuit illustrated in FIG. 1.

FIG. 2 is a diagram illustrating the configuration of the first receiving circuit 111 illustrated in FIG. 1. Referring to FIG. 2, the first receiving circuit 111 may include one or more buffers and one or more amplifiers. Each of the one or more buffers may be a CML (Current Mode Logic) buffer to perform a different amplification operation. The buffer may be an amplifier circuit with a gain of 1. The amplifier may be an amplifier circuit with a gain larger than 1. The first receiving circuit 111 may include a first buffer 210, a second buffer 220 and a first amplifier 230. The first buffer 210, the second buffer 220 and the first amplifier 230 may be operated by a first supply voltage VCC1 supplied thereto. Each of the first and second buffers 210 and 220 may be a CML buffer. The first buffer 210 may receive the input signal IN and a reference voltage VREF, and generate a first amplified signal pair AO1 and AO1B by differentially amplifying the input signal IN and the reference voltage VREF. The reference voltage VREF may have a voltage level corresponding to the middle of the range in which the input signal IN swings. The first buffer 210 may be enabled based on the frequency mode signal LSM, the voltage mode signal VM and an enable signal EN, and differentially amplify the input signal IN and the reference voltage VREF. The first buffer 210 may receive a complementary signal LSMB of the frequency mode signal, a complementary signal VMB of the voltage mode signal, and the enable signal EN. The enable signal EN may be a control signal which may be enabled at the time point that the input signal IN is transmitted or before the input signal IN is transmitted, such that the signal receiving device 100 can perform an operation of receiving the input signal IN. The second buffer 220 may receive the first amplified signal pair AO1 and AO1B outputted from the first buffer 210. The second buffer 220 may generate a second amplified signal pair AO2 and AO2B by differentially amplifying the first amplified signal pair AO1 and AO1B. The second buffer 220 may be enabled based on the frequency mode signal LSM, the voltage mode signal VM and the enable signal EN, and differentially amplify the first amplified signal pair AO1 and AO1B. The second buffer 220 may receive the complementary signal LSMB of the frequency mode signal, the complementary signal VMB of the voltage mode signal, and the enable signal EN. The first amplifier 230 may receive the second amplified signal pair AO2 and AO2B outputted from the second buffer 220. The first amplifier 230 may generate the first received signal RS1 by differentially amplifying the second amplified signal pair AO2 and AO2B. The first received signal RS1 may have a larger gain than the second amplified signal pair AO2 and AO2B. The first amplifier 230 may be enabled based on the frequency mode signal LSM, the voltage mode signal VM and the enable signal EN, and differentially amplify the second amplified signal pair AO2 and AO2B. The first amplifier 230 may receive the complementary signal LSMB of the frequency mode signal, the complementary signal VMB of the voltage mode signal, and a delayed enable signal DEN. The delayed enable signal DEN may be generated by delaying the enable signal EN for a random time. In order to prevent the first received signal RS1 from being generated before the first and second buffers 210 and 220 perform a sufficient amplification operation, the first amplifier 230 may be enabled later than the first and second buffers 210 and 220, based on the delayed enable signal DEN, and perform an amplification operation. FIG. 2 illustrates that the first receiving circuit 111 includes two buffers. However, the first receiving circuit 111 may include a smaller or larger number of buffers than two.

Figure 3:
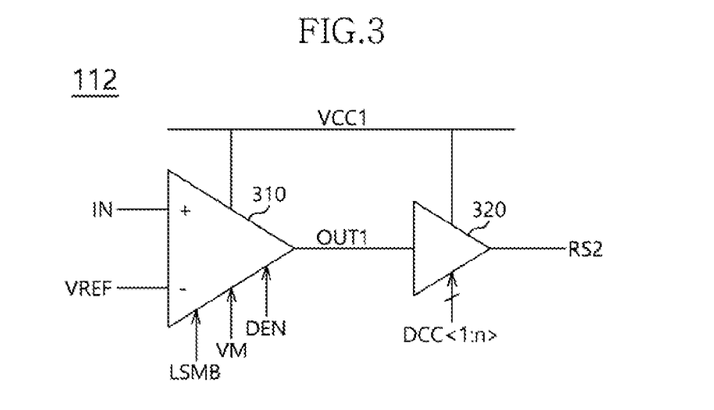
FIG. 3 is a diagram illustrating a configuration of a second receiving circuit illustrated in FIG. 1.

FIG. 3 is a diagram illustrating the configuration of the second receiving circuit 112 illustrated in FIG. 1. Referring to FIG. 3, the second receiving circuit 112 may include a second amplifier 310 and a duty corrector 320. The second amplifier 310 may be an amplifier circuit with a gain larger than 1. The second amplifier 310 and the duty corrector 320 may be operated by the first supply voltage VCC1 supplied thereto. The second amplifier 310 may receive the input signal IN and the reference voltage VREF. The second amplifier 310 may generate a first output signal OUT1 by differentially amplifying the input signal IN and the reference voltage VREF. The second amplifier 310 may be enabled based on the frequency mode signal LSM, the voltage mode signal VM and the enable signal EN, and differentially amplify the input signal IN and the reference voltage VREF. The second amplifier 310 may receive the complementary signal LSMB of the frequency mode signal, the voltage mode signal VM, and the delayed enable signal DEN. The duty corrector 320 may receive the first output signal OUT1 outputted from the second amplifier 310. The duty corrector 320 may correct the duty of the first output signal OUT1 based on a duty control signal DCC<1:n> where n is an integer equal to or more than 2. The duty corrector 320 may output the first output signal OUT1, having a duty that is corrected, as the second received signal RS2.

Figure 4:
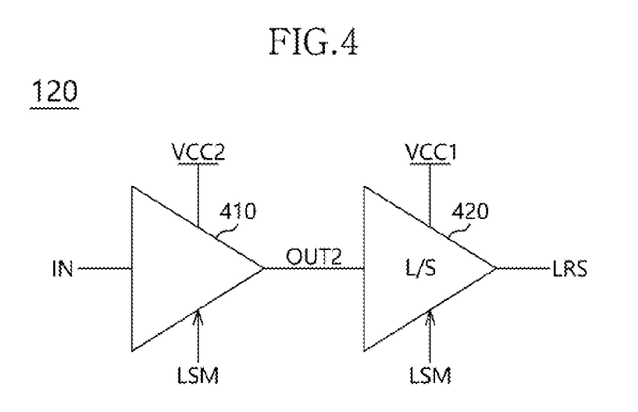
FIG. 4 is a diagram illustrating a configuration of a low-speed receiving circuit illustrated in FIG. 1.

FIG. 4 is a diagram illustrating the configuration of the low-speed receiving circuit 120 illustrated in FIG. 1. Referring to FIG. 4, the low-speed receiving circuit 120 may include a driver 410 and a level shifter (L/S) 420. The driver 410 may be operated by a second supply voltage VCC2 supplied thereto, and the level shifter 420 may be operated by the first supply voltage VCC1 supplied thereto. The driver 410 may receive the input signal IN, and generate a second output signal OUT2 by driving the second output signal OUT2 to a voltage level corresponding to the second supply voltage VCC2 based on the input signal IN. The driver 410 may raise a voltage level of the second output signal to the voltage level corresponding to the second supply voltage VCC2. The driver 410 may be enabled based on the frequency mode signal LSM, and drive the input signal IN. The level shifter 420 may receive the second output signal OUT2 outputted from the driver 410. The level shifter 420 may generate the low-speed received signal LRS by raising the voltage level of the second output signal OUT2 to a voltage level corresponding to the first supply voltage VCC1.

The first supply voltage VCC1 may have a higher voltage level than the second supply voltage VCC2. The second supply voltage VCC2 may be an external supply voltage supplied from the external power supply. The first supply voltage VCC1 may be an internal supply voltage which is generated based on the second supply voltage VCC2. For example, the first supply voltage VCC1 may be a pumping voltage generated by pumping the second supply voltage VCC2. The voltage mode signal VM for controlling activation of the first and second receiving circuits 111 and 112 may be generated based on the voltage level of the second supply voltage VCC2.

Referring to FIGS. 1 and 4, the operation of the signal receiving device 100 in accordance with an embodiment will be described as follows. The first receiving circuit 111 of the high-speed receiving circuit 110 may have the highest performance, but consume the largest amount of power. The low-speed receiving circuit 120 may have the lowest performance, but consume the smallest amount of power. The second receiving circuit 112 of the high-speed receiving circuit 110 may have lower performance than the first receiving circuit 111, but have higher performance than the low-speed receiving circuit 120. The second receiving circuit 112 may consume a smaller amount of power than the first receiving circuit 111, but consume a larger amount of power than the low-speed receiving circuit 120. In a communication environment where the operation frequency is high and the voltage level of the external supply voltage is low, both of the frequency mode signal LSM and the voltage mode signal VM may have a logic low level. Therefore, the first receiving circuit 111 may be enabled. The first receiving circuit 111 may receive the input signal IN and generate the first received signal RS1, and the selection circuit 113 may output the first received signal RS1 outputted from the first receiving circuit 111 as the high-speed received signal HRS, based on the voltage mode signal VM. The high-speed synchronization circuit 130 may generate the high-speed synchronized signal HSS by synchronizing the high-speed received signal HRS with the clock signal CLK. The selection circuit 150 may output the high-speed synchronized signal HSS outputted from the high-speed synchronization circuit 130 as the internal signal INS, based on the frequency mode signal LSM.

In a communication environment where the operation frequency is high and the voltage level of the external supply voltage is high, the frequency mode signal LSM may have a logic low level, and the voltage mode signal VM may have a logic high level. Therefore, the second receiving circuit 112 may be enabled. The second receiving circuit 112 may receive the input signal IN and generate the second received signal RS2, and the selection circuit 113 may output the second received signal RS2 outputted from the second receiving circuit 112 as the high-speed received signal HRS, based on the voltage mode signal VM. The high-speed synchronization circuit 130 may generate the high-speed synchronized signal HSS by synchronizing the high-speed received signal HRS with the clock signal CLK. The selection circuit 150 may output the high-speed synchronized signal HSS outputted from the high-speed synchronization circuit 130 as the internal signal INS, based on the frequency mode signal LSM.

In a communication environment where the operation frequency is low, the frequency mode signal LSM may have a logic high level. Therefore, the first and second receiving circuits 111 and 112 may be disabled, and the low-speed receiving circuit 120 may be enabled. The low-speed receiving circuit 120 may receive the input signal IN and generate the low-speed received signal LRS. The low-speed synchronization circuit 140 may generate the low-speed synchronized signal LSS by synchronizing the low-speed received signal LRS with the clock signal CLK. The selection circuit 150 may output the low-speed synchronized signal LSS outputted from the low-speed synchronization circuit 140 as the internal signal INS, based on the frequency mode signal LSM.

The signal receiving device 100 may have a plurality of receiving circuits with different performances and different current characteristics, select one of the plurality of receiving circuits according to the communication environment such as the operation frequency and/or the voltage level of the external supply voltage, and receive the input signal IN. Therefore, while optimizing power consumption, the signal receiving device 100 can accurately generate the internal signal INS having a logic level corresponding to the input signal IN. The signal receiving device 100 may have a circuit configuration for selecting one of signals received through the high-speed receiving path A and the low-speed receiving path B before outputting the selected signal as the internal signal INS. That is, the signals received through the high-speed receiving circuit 110 and the low-speed receiving circuit 120 may be synchronized with the clock signal CLK through the high-speed synchronization circuit 130 and the low-speed synchronization circuit 140, respectively, and then selected as the internal signal INS by the selection circuit 150. Such a structure can minimize the number of stages in the high-speed receiving circuit 110 and the low-speed receiving circuit 120. Thus, the signal receiving device 100 can perform the signal receiving operation more accurately. Furthermore, such a structure controls the signal receiving device 100 to operate insensitively to a change in duty ratio or delay amount due to a jitter caused by noise of the supply voltage and a PVT (Process/Voltage/Temperature) variation.

Figure 5:
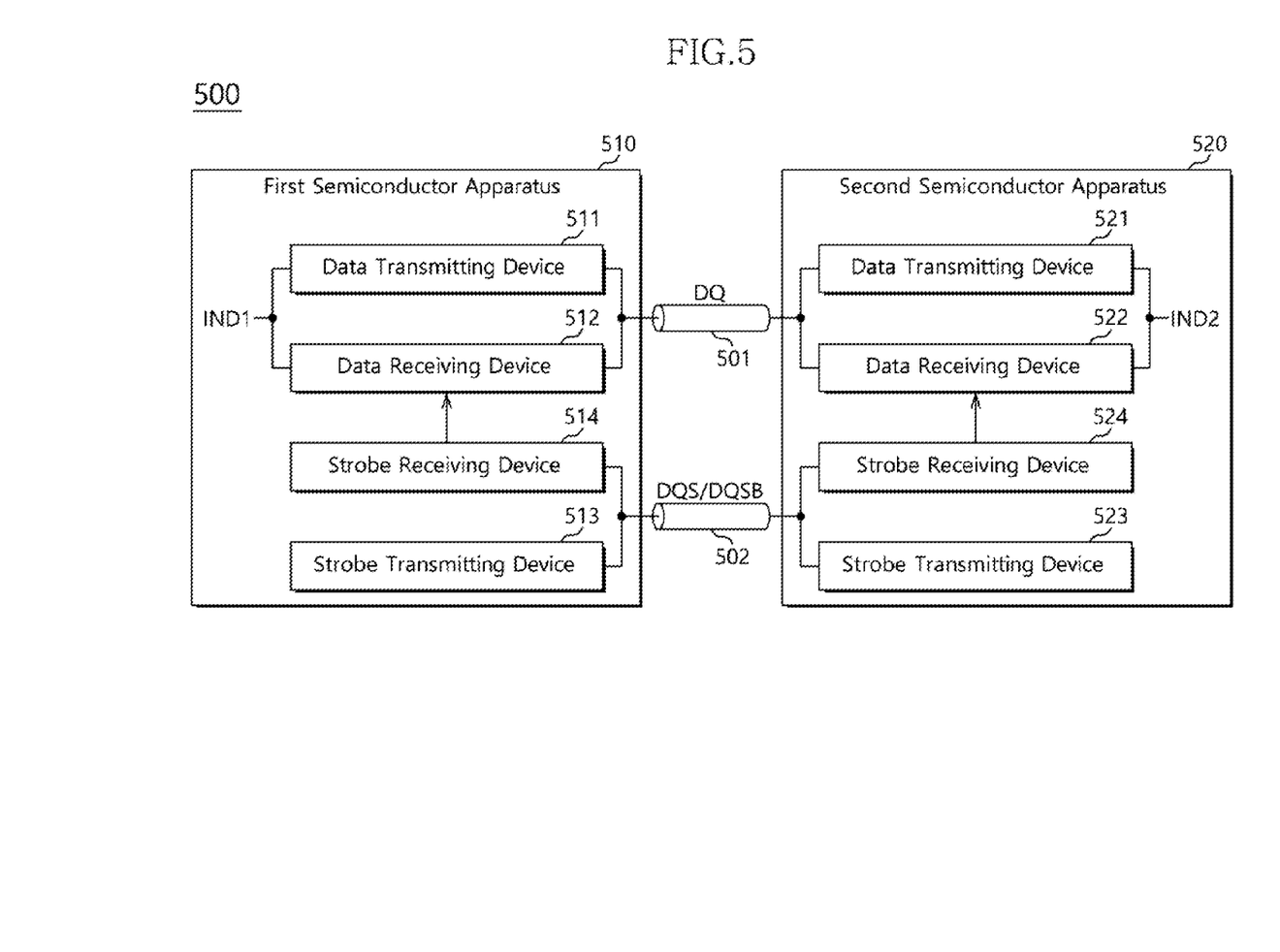
FIG. 5 is a diagram illustrating a configuration of a semiconductor system in accordance with an embodiment.

FIG. 5 is a diagram illustrating a configuration of a semiconductor system 500 in accordance with an embodiment. Referring to FIG. 5, the semiconductor system 500 may include a first semiconductor apparatus 510 and a second semiconductor apparatus 520. The first semiconductor apparatus 510 may provide various control signals required for an operation of the second semiconductor apparatus 520. The first semiconductor apparatus 510 may include various types of host devices. For example, the first semiconductor apparatus 510 may include a CPU (Central Processing Unit), a GPU (Graphics Processing Unit), an MMP (Multi-Media Processor), a digital signal processor, an AP (Application Processor) and a memory controller. The second semiconductor apparatus 520 may be a memory apparatus, for example. The memory apparatus may include a volatile memory and a nonvolatile memory. The volatile memory may include an SRAM (Static RAM), DRAM (Dynamic RAM) and SDRAM (Synchronous DRAM), and the nonvolatile memory may include a ROM (Read Only Memory), PROM (Programmable ROM), EEPROM (Electrically Erasable and Programmable ROM), EPROM (Electrically Programmable ROM), flash memory, PRAM (Phase change RAM), MRAM (Magnetic RAM), RRAM (Resistive RAM) and FRAM (Ferroelectric RAM).

The first semiconductor apparatus 510 and the second semiconductor apparatus 520 may be coupled to each other through a plurality of buses. The plurality of buses may be signal transmission paths, links or channels for transmitting signals. The plurality of buses may include a data bus 501, a data strobe bus 502 and the like. The data bus 501 and the data strobe bus 502 may be two-way buses. The first semiconductor apparatus 510 may transmit data DQ to the second semiconductor apparatus 520 or receive data DQ from the second semiconductor apparatus 520 through the data bus 501. The second semiconductor apparatus 520 may receive data DQ from the first semiconductor apparatus 510 or transmit data DQ to the first semiconductor apparatus 510 through the data bus 501. The data bus 501 may include a plurality of data transmission lines, and a plurality of data may be simultaneously transmitted through the plurality of data transmission lines. The first semiconductor apparatus 510 may transmit a data strobe signal DQS to the second semiconductor apparatus 520 or receive the data strobe signal DQS from the second semiconductor apparatus 520 through the data strobe bus 502. The second semiconductor apparatus 520 may transmit the data strobe signal DQS to the first semiconductor apparatus 510 or receive the data strobe signal DQS from the first semiconductor apparatus 510 through the data strobe bus 502. The data strobe bus 502 may include a plurality of data strobe transmission lines, and the data strobe signal DQS and a complementary strobe signal DQSB may be transmitted through the plurality of data strobe transmission lines. Although not illustrated, a clock bus, a command bus, an address bus and the like may be further provided between the first and second semiconductor apparatuses 510 and 520. The clock bus, the command bus and the address bus may be one-way buses. The first semiconductor apparatus 510 may provide a clock signal to the second semiconductor apparatus 520 through the clock bus. The first semiconductor apparatus 510 may provide a command signal to the second semiconductor apparatus 520 through the command bus. The first semiconductor apparatus 510 may provide an address signal to the second semiconductor apparatus 520 through the address bus.

The first semiconductor apparatus 510 may include a data transmitting device 511, a data receiving device 512, a strobe transmitting device 513 and a strobe receiving device 514. The data transmitting device 511 may drive the data bus 501 based on internal data IND1 of the first semiconductor apparatus 510, and transmit the data DQ to the second semiconductor apparatus 520 through the data bus 501. The data receiving device 512 may receive data transmitted from the second semiconductor apparatus 520 through the data bus 501, and generate the internal data IND1. The strobe transmitting device 513 may transmit the data strobe signal DQS to the second semiconductor apparatus 520 through the data strobe bus 502, the data strobe signal DQS toggling in synchronization with the data DQ transmitted from the data transmitting device 511 through the data bus 501. The strobe receiving device 514 may receive the data strobe signal DQS transmitted from the second semiconductor apparatus 520 through the data strobe bus 502. The data strobe signal received by the strobe receiving device 514 may be provided to the data receiving device 512. The data receiving device 512 may receive the data strobe signal DQS, and generate the internal data IND1 from the data DQ in synchronization with the data strobe signal DQS. The signal receiving device 100 illustrated in FIG. 1 may be applied as the data receiving device 512. As such, in an embodiment, the signal receiving device 100 may receive the data DQ as the input signal IN, may receive the data strobe signal DQS as the clock signal CLK, and may generate the internal data IND1 as the internal signal INS.

The second semiconductor apparatus 520 may include a data transmitting device 521, a data receiving device 522, a strobe transmitting device 523 and a strobe receiving device 524. The data transmitting device 521 may drive the data bus 501 based on internal data IND2 of the second semiconductor apparatus 520, and transmit the data DQ to the first semiconductor apparatus 510 through the data bus 501. The data receiving device 522 may receive the data DQ transmitted from the first semiconductor apparatus 510 through the data bus 501, and generate the internal data IND2. The strobe transmitting device 523 may transmit a data strobe signal DQS to the first semiconductor apparatus 510 through the data strobe bus 502, the data strobe signal DQS toggling in synchronization with the data DQ transmitted from the data transmitting device 521 through the data bus 501. The strobe receiving device 524 may receive the data strobe signal DQS transmitted from the first semiconductor apparatus 510 through the data strobe bus 502. The data strobe signal DQS received by the strobe receiving device 524 may be provided to the data receiving device 522. The data receiving device 522 may receive the data strobe signal DQS, and generate the internal data IND2 from the data DQ in synchronization with the data strobe signal DQS. The signal receiving device 100 illustrated in FIG. 1 may be applied as the data receiving device 522. As such, in an embodiment, the signal receiving device 100 may receive the data DQ as the input signal IN, may receive the data strobe signal DQS as the clock signal CLK, and may generate the internal data IND2 as the internal signal INS.

Figure 6:
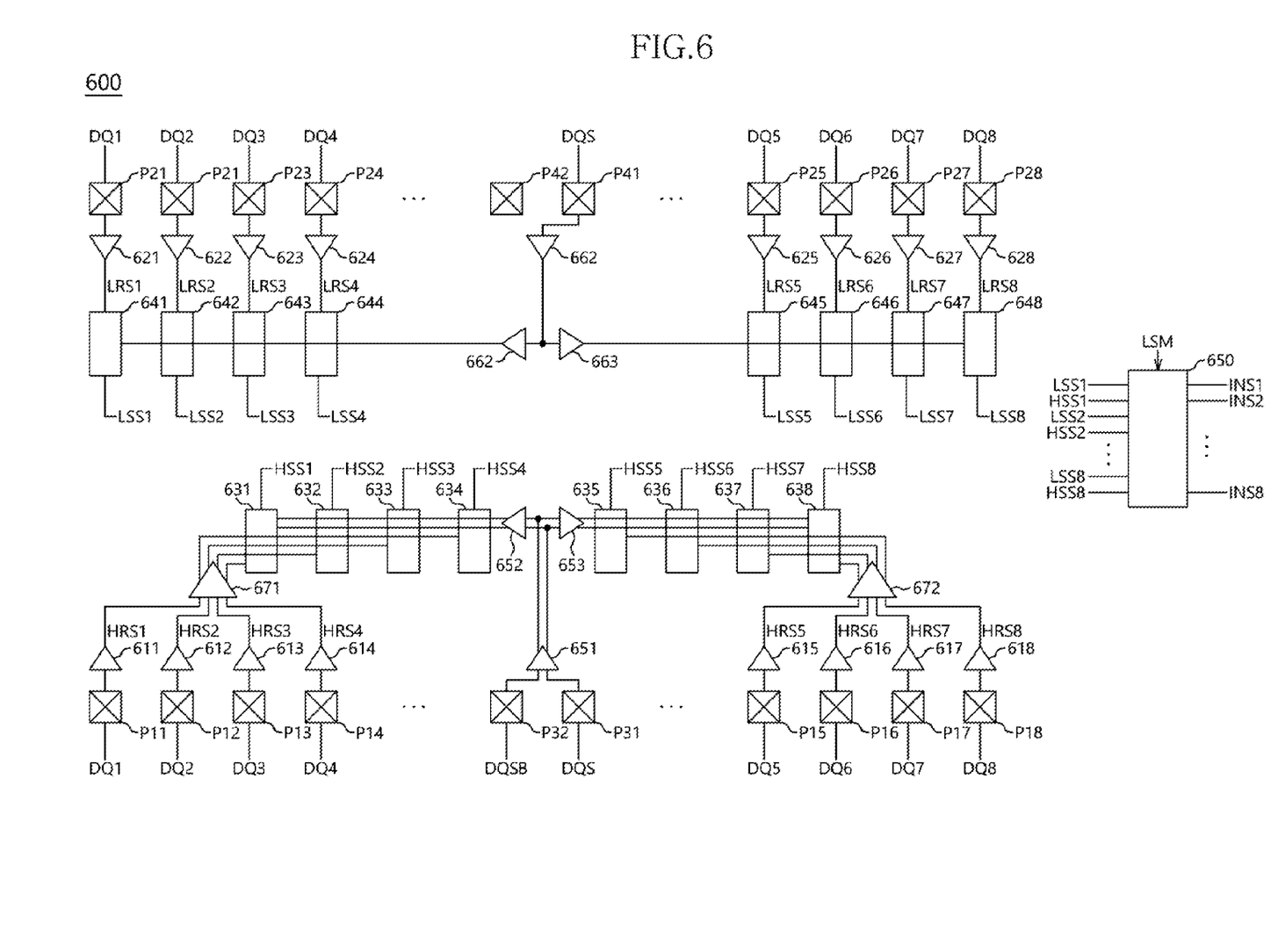
FIG. 6 is a diagram illustrating a configuration of a semiconductor apparatus in accordance with an embodiment.

FIG. 6 is a diagram illustrating a configuration of a semiconductor apparatus 600 in accordance with an embodiment. The semiconductor apparatus 600 may include a plurality of high-speed data pads, a plurality of high-speed strobe pads, a plurality of low-speed data pads and one or more low-speed strobe pads. The plurality of high-speed data pads and the plurality of low-speed data pads may be coupled to a data bus in common. FIG. 6 illustrates that the data bus includes eight data transmission lines, and the semiconductor apparatus 600 receives eight data DQ1 to DQ8 through the eight data transmission lines at the same time. However, the number of data received by the semiconductor apparatus 600 is not limited thereto. The semiconductor apparatus 600 may be coupled to a smaller or larger number of data transmission lines than eight, and receive a smaller or larger number of data than eight at the same time. A first high-speed data pad P11 and a first low-speed data pad P21 may be coupled to a first data transmission line in common, and receive first data DQ1 in common. A second high-speed data pad P12 and a second low-speed data pad P22 may be coupled to a second data transmission line in common, and receive second data DQ2 in common. A third high-speed data pad P13 and a third low-speed data pad P23 may be coupled to a third data transmission line in common, and receive third data DQ3 in common. A fourth high-speed data pad P14 and a fourth low-speed data pad P24 may be coupled to a fourth data transmission line in common, and receive fourth data DQ4 in common. A fifth high-speed data pad P15 and a fifth low-speed data pad P25 may be coupled to a fifth data transmission line in common, and receive fifth data DQ5 in common. A sixth high-speed data pad P16 and a sixth low-speed data pad P26 may be coupled to a sixth data transmission line in common, and receive sixth data DQ6 in common. A seventh high-speed data pad P17 and a seventh low-speed data pad P27 may be coupled to a seventh data transmission line in common, and receive seventh data DQ7 in common. An eighth high-speed data pad P18 and an eighth low-speed data pad P28 may be coupled to an eighth data transmission line in common, and receive eighth data DQ8 in common.

The semiconductor apparatus 600 may include a plurality of high-speed receiving circuits 611 to 618. The plurality of high-speed receiving circuits 611 to 618 may be coupled one-to-one to the plurality of high-speed data pads P11 to P18, and receive the data DQ1 to DQ8 inputted through the plurality of high-speed data pads P11 to P18, respectively. The first high-speed receiving circuit 611 may be coupled to the first high-speed data pad P11, and receive the first data DQ1 through the first high-speed data pad P11 and generate a first high-speed received signal HRS1. The second high-speed receiving circuit 612 may be coupled to the second high-speed data pad P12, and receive the second data DQ2 through the second high-speed data pad P12 and generate a second high-speed received signal HRS2. The third high-speed receiving circuit 613 may be coupled to the third high-speed data pad P13, and receive the third data DQ3 through the third high-speed data pad P13 and generate a third high-speed received signal HRS3. The fourth high-speed receiving circuit 614 may be coupled to the fourth high-speed data pad P14, and receive the fourth data DQ4 through a fourth high-speed data pad P14 and generate the fourth high-speed received signal HRS4. The fifth high-speed receiving circuit 615 may be coupled to the fifth high-speed data pad P15, and receive the fifth data DQ5 through the fifth high-speed data pad P15 and generate a fifth high-speed received signal HRS5. The sixth high-speed receiving circuit 616 may be coupled to the sixth high-speed data pad P16, and receive the sixth data DQ6 through the sixth high-speed data pad P16 and generate a sixth high-speed received signal HRS6. The seventh high-speed receiving circuit 617 may be coupled to the seventh high-speed data pad P17, and receive the seventh data DQ7 through the seventh high-speed data pad P17 and generate a seventh high-speed received signal HRS7. The eighth high-speed receiving circuit 618 may be coupled to the eighth high-speed data pad P18, and receive the eighth data DQ8 through the eighth high-speed data pad P18 and generate an eighth high-speed received signal HRS8. The high-speed receiving circuit 110 illustrated in FIG. 1 may be applied as each of the first to eighth high-speed receiving circuits 611 to 618.

The semiconductor apparatus 600 may include a plurality of low-speed receiving circuits 621 to 628. The plurality of low-speed receiving circuits 621 to 628 may be coupled one-to-one to the plurality of low-speed data pads P21 to P28, and receive the data DQ1 to DQ8 inputted through the plurality of low-speed data pads P21 to P28, respectively. The first low-speed receiving circuit 621 may be coupled to the first low-speed data pad P21, and receive the first data DQ1 through the first low-speed data pad P21 and generate a first low-speed received signal LRS1. The second low-speed receiving circuit 622 may be coupled to the second low-speed data pad P22, and receive the second data DQ2 through the second low-speed data pad P22 and generate a second low-speed received signal LRS2. The third low-speed receiving circuit 623 may be coupled to the third low-speed data pad P23, and receive the third data DQ3 through the third low-speed data pad P23 and generate a third low-speed received signal LRS3. The fourth low-speed receiving circuit 624 may be coupled to the fourth low-speed data pad P24, and receive a fourth data DQ4 through the fourth low-speed data pad P24 and generate the fourth low-speed received signal LRS4. The fifth low-speed receiving circuit 625 may be coupled to the fifth low-speed data pad P25, and receive the fifth data DQ5 through the fifth low-speed data pad P25 and generate a fifth low-speed received signal LRS5. The sixth low-speed receiving circuit 626 may be coupled to the sixth low-speed data pad P26, and receive the sixth data DQ6 through the sixth low-speed data pad P26 and generate a sixth low-speed received signal LRS6. The seventh low-speed receiving circuit 627 may be coupled to the seventh low-speed data pad P27, and receive the seventh data DQ7 through the seventh low-speed data pad P27 and generate a seventh low-speed received signal LRS7. The eighth low-speed receiving circuit 628 may be coupled to the eighth low-speed data pad P28, and receive an eighth data DQ8 through the eighth low-speed data pad P28 and generate the eighth low-speed received signal LRS8. The low-speed receiving circuit 120 illustrated in FIG. 1 may be applied as each of the first to eighth low-speed receiving circuits 621 to 628.

The semiconductor apparatus 600 may receive the data strobe signal DQS as a differential signal when the operation frequency is high, and receive the data strobe signal DQS as a single-ended signal when the operation frequency is low. The plurality of high-speed strobe pads and the one or more low-speed strobe pads may be coupled to the strobe bus in common. A first high-speed strobe pad P31 and a low-speed strobe pad P41 may be coupled to a first strobe transmission line in common, and receive the data strobe signal DQS in common. A second high-speed strobe pad P32 may be coupled to a second strobe transmission line, and receive the complementary data strobe signal DQSB. Beside the low-speed strobe pad P41, a pad 42 corresponding to the second high-speed strobe pad P32 may be designed. However, the pad P42 might not be used. The semiconductor apparatus 600 may include a high-speed strobe receiving circuit 651 and a low-speed strobe receiving circuit 661. Each of the high-speed strobe receiving circuit 651 and the low-speed strobe receiving circuit 661 may correspond to any one component of the strobe receiving devices 514 and 524 illustrated in FIG. 5. The high-speed strobe receiving circuit 651 may differentially amplify the data strobe signal DQS and the complementary data strobe signal DQSB, received through the first and second high-speed strobe pads P31 and P32, and output the amplified signals. The low-speed strobe receiving circuit 661 may buffer the data strobe signal DQS received through the low-speed strobe pad P41, and output the buffered signal.

The semiconductor apparatus 600 may include a plurality of high-speed synchronization circuits 631 to 638 and a plurality of low-speed synchronization circuits 641 to 648. The plurality of high-speed synchronization circuits 631 to 638 may receive the data strobe signal pair DQS and DQSB, outputted from the high-speed strobe receiving circuit 651, in common through repeaters 652 and 653. The plurality of high-speed synchronization circuits 631 to 638 may be coupled one-to-one to the plurality of high-speed receiving circuits 611 to 618. The first high-speed synchronization circuit 631 may synchronize the first high-speed received signal HRS1 outputted from the first high-speed receiving circuit 611 with the data strobe signal pair DQS and DQSB, and output a first high-speed synchronized signal HSS1. The second high-speed synchronization circuit 632 may synchronize the second high-speed received signal HRS2 outputted from the second high-speed receiving circuit 612 with the data strobe signal pair DQS and DQSB, and output a second high-speed synchronized signal HSS2. The third high-speed synchronization circuit 633 may synchronize the third high-speed received signal HRS3 outputted from the third high-speed receiving circuit 613 with the data strobe signal pair DQS and DQSB, and output a third high-speed synchronized signal HSS3. The fourth high-speed synchronization circuit 634 may synchronize the fourth high-speed received signal HRS4 outputted from the fourth high-speed receiving circuit 614 with the data strobe signal pair DQS and DQSB, and output a fourth high-speed synchronized signal HSS4. The fifth high-speed synchronization circuit 635 may synchronize the fifth high-speed received signal HRS5 outputted from the fifth high-speed receiving circuit 615 with the data strobe signal pair DQS and DQSB, and output a fifth high-speed synchronized signal HSS5. The sixth high-speed synchronization circuit 636 may synchronize the sixth high-speed received signal HRS6 outputted from the sixth high-speed receiving circuit 616 with the data strobe signal pair DQS and DQSB, and output a sixth high-speed synchronized signal HSS6. The seventh high-speed synchronization circuit 637 may synchronize the seventh high-speed received signal HRS7 outputted from the seventh high-speed receiving circuit 617 with the data strobe signal pair DQS and DQSB, and output a seventh high-speed synchronized signal HSS7. The eighth high-speed synchronization circuit 638 may synchronize the eighth high-speed received signal HRS8 outputted from the eighth high-speed receiving circuit 618 with the data strobe signal pair DQS and DQSB, and output an eighth high-speed synchronized signal HSS8.

The plurality of low-speed synchronization circuits 641 to 648 may receive the data strobe signal DQS, outputted from the low-speed strobe receiving circuit 661, in common through repeaters 662 and 663. The plurality of low-speed synchronization circuits 641 to 648 may be coupled one-to-one to the plurality of low-speed receiving circuits 621 to 628. The first low-speed synchronization circuit 641 may synchronize the first low-speed received signal LRS1 outputted from the first low-speed receiving circuit 621 with the data strobe signal DQS, and output a first low-speed synchronized signal LSS1. The second low-speed synchronization circuit 642 may synchronize the second low-speed received signal LRS2 outputted from the second low-speed receiving circuit 622 with the data strobe signal DQS, and output a second low-speed synchronized signal LSS2. The third low-speed synchronization circuit 643 may synchronize the third low-speed received signal LRS3 outputted from the third low-speed receiving circuit 623 with the data strobe signal DQS, and output a third low-speed synchronized signal LSS3. The fourth low-speed synchronization circuit 644 may synchronize the fourth low-speed received signal LRS4 outputted from the fourth low-speed receiving circuit 624 with the data strobe signal DQS, and output a fourth low-speed synchronized signal LSS4. The fifth low-speed synchronization circuit 645 may synchronize the fifth low-speed received signal LRS5 outputted from the fifth low-speed receiving circuit 625 with the data strobe signal DQS, and output a fifth low-speed synchronized signal LSS5. The sixth low-speed synchronization circuit 646 may synchronize the sixth low-speed received signal LRS6 outputted from the sixth low-speed receiving circuit 626 with the data strobe signal DQS, and output a sixth low-speed synchronized signal LSS6. The seventh low-speed synchronization circuit 647 may synchronize the seventh low-speed received signal LRS7 outputted from the seventh low-speed receiving circuit 627 with the data strobe signal DQS, and output a seventh low-speed synchronized signal LSS7. The eighth low-speed synchronization circuit 648 may synchronize the eighth low-speed received signal LRS8 outputted from the eighth low-speed receiving circuit 628 with the data strobe signal DQS, and output an eighth low-speed synchronized signal LSS8.

The semiconductor apparatus 600 may include a selection circuit 650. The first to eighth high-speed synchronized signals HSS1 to HSS8 and the first to eighth low-speed synchronized signals LSS1 to LSS8 may be transmitted to the selection circuit 650 through a global line (not illustrated). The selection circuit 650 may output the first to eighth high-speed synchronized signals HSS1 to HSS8 as first to eighth internal signals INS1 to INS8 in the first operation mode. The selection circuit 650 may output the first to eighth low-speed synchronized signals LSS1 to LSS8 as the first to eighth internal signals INS1 to INS8, respectively, in the second operation mode. The selection circuit 650 may receive the frequency mode signal LSM. When the frequency mode signal LSM is at a logic low level, the selection circuit 650 may provide the first to eighth high-speed synchronized signals HSS1 to HSS8 as the first to eighth internal signals INS1 to INS8, respectively. When the frequency mode signal LSM is at a logic high level, the selection circuit 650 may provide the first to eighth low-speed synchronized signals LSS1 to LSS8 as the first to eighth internal signals INS1 to INS8, respectively.

The first to eighth high-speed synchronization circuits 631 to 638 are gathered and disposed adjacent to each other, and the first to eighth low-speed synchronization circuits 641 to 648 may be distributed and disposed adjacent to the first to eighth low-speed data pads P21 to P28, respectively. The first to eighth high-speed synchronization circuits 631 to 638 may be gathered and disposed in an area adjacent to the repeaters 652 and 653. The first to fourth high-speed received signals HRS1 to HRS4 may be driven by a repeater 671, and inputted to the first to fourth high-speed synchronization circuits 631 to 634. The fifth to eighth high-speed received signals HRS5 to HRS8 may be driven by a repeater 672, and inputted to the fifth to eighth high-speed synchronization circuits 635 to 638. When the synchronization circuits for synchronizing the received signals with the clock signal are gathered and disposed adjacent to each other, it is possible to reduce the possibility that a skew will occur between timings to synchronize the received signals with the clock signal. Thus, the semiconductor apparatus 600 can more accurately receive a signal with a high frequency. When the synchronization circuits are distributed and disposed, the length of a line through which the received signals are transmitted to the synchronization circuits can be reduced, which makes it possible to improve the area efficiency of the semiconductor apparatus 600. In the present embodiment, the first to eighth high-speed synchronization circuits 631 to 638 which synchronize the data DQ1 to DQ8, received at a relatively high frequency, with the data strobe signal pair DQS and DQSB may be gathered and disposed adjacent to each other, which makes it possible to further improve the receiving characteristics of the data DQ1 to DQ8. The first to eighth low-speed synchronization circuits 641 to 648 which synchronize data, received at a relatively low frequency, with the data strobe signal DQS may be distributed and disposed, which makes it possible to improve the area efficiency of the semiconductor apparatus 600.

While various embodiments have been described above, it will be understood to those skilled in the art that the embodiments described are examples only. Accordingly, the operating method of a data storage device described herein should not be limited based on the described embodiments.

What is claimed is:

1. A semiconductor apparatus comprising:
    a plurality of high-speed data receiving circuits configured to receive a plurality of data through a plurality of high-speed data pads, respectively, and generate a plurality of high-speed received signals;
    a high-speed strobe receiving circuit configured to receive a data strobe signal and a complementary data strobe signal through a plurality of high-speed strobe pads;
    a plurality of high-speed synchronization circuits configured to synchronize the plurality of high-speed received signals with the data strobe signal and the complementary data strobe signal, respectively, to generate a plurality of high-speed synchronized signals;
    a plurality of low-speed data receiving circuits configured to receive the plurality of data through a plurality of low-speed data pads, respectively, and generate a plurality of low-speed received signals;
    a low-speed strobe receiving circuit configured to receive the data strobe signal through one or more low-speed strobe pads;
    a plurality of low-speed synchronization circuits configured to synchronize the plurality of low-speed received signals with the data strobe signal to generate a plurality of low-speed synchronized signals; and
    a first selection circuit configured to output the plurality of high-speed synchronized signals as a plurality of internal signals or output the plurality of low-speed synchronized signals as the plurality of internal signals, according to an operation frequency.

2. The semiconductor apparatus according to claim 1, wherein the first selection circuit outputs the plurality of high-speed synchronized signals as the plurality of internal signals when the operation frequency is a first frequency, and outputs the plurality of low-speed synchronized signals as the plurality of internal signals when the operation frequency is a second frequency lower than the first frequency.

3. The semiconductor apparatus according to claim 1, wherein each of the plurality of high-speed receiving circuits comprises:
    a first receiving circuit comprising a buffer and a first amplifier, and configured to receive corresponding data among the plurality of data;
    a second receiving circuit comprising a second amplifier, and configured to receive corresponding data among the plurality of data; and
    a second selection circuit configured to output one of a signal outputted from the first receiving circuit and a signal outputted from the second receiving circuit as a corresponding high-speed received signal among the plurality of high-speed received signals, according to the level of an external supply voltage.

4. The semiconductor apparatus according to claim 3, wherein the second selection circuit outputs the first received signal as the high-speed received signal, when the external supply voltage has a first voltage level, and outputs the second received signal as the high-speed received signal when the external supply voltage has a second voltage level higher than the first voltage level.

5. The semiconductor apparatus according to claim 1, wherein the plurality of high-speed synchronization circuits are gathered and disposed adjacent to each other.

6. The semiconductor apparatus according to claim 1, wherein the plurality of low-speed synchronization circuits are distributed and disposed adjacent to the plurality of low-speed data pads, respectively.

7. A semiconductor apparatus comprising:
a plurality of high-speed data receiving circuits configured to receive a plurality of data through a plurality of high-speed data pads, respectively, and generate a plurality of high-speed received signals;
a plurality of high-speed synchronization circuits configured to synchronize the plurality of high-speed received signals with a data strobe signal and a complementary data strobe signal, respectively, to generate a plurality of high-speed synchronized signals;
a plurality of low-speed data receiving circuits configured to receive the plurality of data through a plurality of low-speed data pads, respectively, and generate a plurality of low-speed received signals;
a plurality of low-speed synchronization circuits configured to synchronize the plurality of low-speed received signals with the data strobe signal to generate a plurality of low-speed synchronized signals; and
a first selection circuit configured to output the plurality of high-speed synchronized signals as a plurality of internal signals in a first operation mode and output the plurality of low-speed synchronized signals as the plurality of internal signals in a second operation mode.

8. The semiconductor apparatus according to claim 7, wherein an operation frequency in the first operation mode is higher than an operation frequency in the second operation mode.

9. The semiconductor apparatus according to claim 7, wherein each of the plurality of high-speed receiving circuits comprises:
a first receiving circuit comprising a buffer and a first amplifier, and configured to receive corresponding data among the plurality of data;
a second receiving circuit comprising a second amplifier, and configured to receive corresponding data among the plurality of data; and
a second selection circuit configured to output one of a signal outputted from the first receiving circuit and a signal outputted from the second receiving circuit as a corresponding high-speed received signal among the plurality of high-speed received signals, according to the level of an external supply voltage.

10. The semiconductor apparatus according to claim 9, wherein the second selection circuit outputs the first received signal as the high-speed received signal, when the external supply voltage has a first voltage level, and outputs the second received signal as the high-speed received signal when the external supply voltage has a second voltage level higher than the first voltage level.

11. The semiconductor apparatus according to claim 7, wherein the plurality of high-speed synchronization circuits are gathered and disposed adjacent to each other.

12. The semiconductor apparatus according to claim 7, wherein the plurality of low-speed synchronization circuits are distributed and disposed adjacent to the plurality of low-speed data pads, respectively.

13. The semiconductor apparatus according to claim 7, further comprising:
a high-speed strobe receiving circuit configured to receive the data strobe signal and the complementary data strobe signal through a plurality of high-speed strobe pads; and
a low-speed strobe receiving circuit configured to receive the data strobe signal through one or more low-speed strobe pads.

* * * * *